United States Patent [19]

Aketagawa et al.

[11] Patent Number: 5,095,190
[45] Date of Patent: Mar. 10, 1992

[54] EXPOSURE APPARATUS

[75] Inventors: Masato Aketagawa, Yokohama; Shinji Utamura, Tokyo, both of Japan

[73] Assignee: Canon Kabushiki Kaisha, Tokyo, Japan

[21] Appl. No.: 550,194

[22] Filed: Jul. 10, 1990

Related U.S. Application Data

[63] Continuation of Ser. No. 449,328, Dec. 11, 1989, abandoned, which is a continuation of Ser. No. 358,509, May 30, 1989, abandoned, which is a continuation of Ser. No. 291,346, Dec. 29, 1988, abandoned, which is a continuation of Ser. No. 162,975, Mar. 2, 1988, abandoned.

[30] Foreign Application Priority Data

Mar. 3, 1987 [JP] Japan ................. 62-046752
Jan. 11, 1988 [JP] Japan ................. 63-3546

[51] Int. Cl.⁵ .............................................. B23K 26/02
[52] U.S. Cl. ......................... 219/121.78; 219/121.74; 219/121.82
[58] Field of Search ............... 219/121.63, 121.64, 219/121.78, 121.82; 346/762; 250/548; 356/399–401, 358

[56] References Cited

U.S. PATENT DOCUMENTS

| | | | |
|---|---|---|---|
| 4,131,365 | 12/1978 | Pryor | 356/356 |
| 4,156,124 | 5/1979 | Macken et al. | 219/121.78 X |
| 4,687,322 | 8/1987 | Tanimoto et al. | 355/55 |
| 4,690,528 | 9/1987 | Tanimoto et al. | 353/101 |
| 4,699,505 | 10/1987 | Komoriya et al. | 355/30 |
| 4,720,621 | 1/1988 | Langen | 219/121.69 X |
| 4,769,523 | 9/1988 | Tanimoto et al. | 219/121.82 X |
| 4,773,750 | 9/1988 | Bruning | 353/122 |
| 4,811,055 | 3/1989 | Hirose | 335/53 |

FOREIGN PATENT DOCUMENTS

| | | |
|---|---|---|
| 1038935 | 9/1978 | Canada ............ 219/121.78 |
| 60-178423 | 9/1985 | Japan . |
| 60-214334 | 10/1985 | Japan . |
| 60-214335 | 10/1985 | Japan . |
| 60-257519 | 12/1985 | Japan . |
| 61-181128 | 8/1986 | Japan . |

*Primary Examiner*—C. L. Albritton
*Attorney, Agent, or Firm*—Fitzpatrick, Cella, Harper & Scinto

[57] ABSTRACT

A projection exposure apparatus includes an illumination system for illuminating a mask pattern; a projection optical system for projecting the mask pattern being illuminated upon the surface of a wafer so as to expose the same to the mask pattern; a wavelength detecting device effective to detect the wavelength of a light from a light source included in the illumination system; and a control device operable, in accordance with an output signal from the wavelength detecting device, to control at least one of the projection magnification of the projection optical system and the relative position of the wafer with respect to the imaging position of the mask pattern.

24 Claims, 5 Drawing Sheets

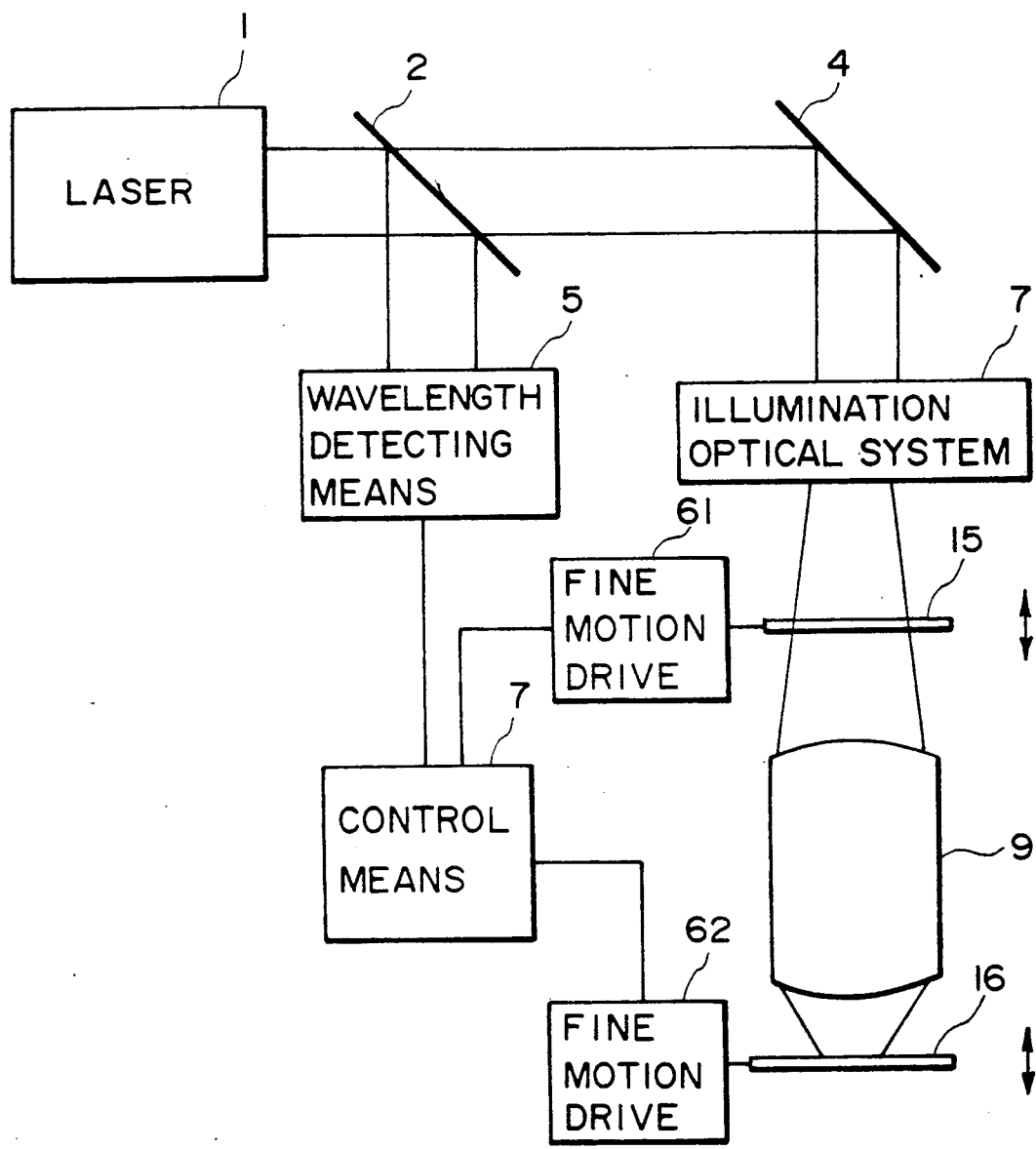
F I G. 1

EXPOSURE APPARATUS

This application is a continuation of prior application Ser. No. 07/449,328 filed Dec. 11, 1989, which application is a continuation of prior application Ser. No. 07/538,509 filed May 30, 1989, which application is a continuation of prior application Ser. No. 07/291,346 filed Dec. 29, 1988, which application is a continuation of prior application Ser. No. 07/162,975 filed Mar. 2, 1988, all prior applications now abandoned.

FIELD OF THE INVENTION AND RELATED ART

This invention relates to an exposure apparatus. More particularly, the invention is concerned with an exposure apoaratus which is suitably usable in the manufacture of semiconductor microcircuits such as intgrated circuits (ICs), large scaled integrated circuits (LSIs) or otherwise, for exposing by projection a workpiece surface such as a semiconductor wafer surface to a pattern formed on a mask or reticle by use of a projection optical system.

Usually, in projection type exposure apparatuses for use in the manufacture of semiconductor microcircuits such as integrated circuits, large scaled integrated circuits or otherwise, a mask or reticle having an electronic circuit pattern is illuminated by an illumination system so that the mask pattern is projected upon the surface of a wafer by a projection optical system, with the result that the wafer surface is exposed to the mask pattern. In such a photolithographic process, it is advantageous to use light of a wavelength in a deep ultraviolet region from the viewpoint of resolution at the surface of the wafer because such light has a small diffraction effect.

Generally, however, optical glass materials forming a projection optical system have a low transmission factor with respect to the wavelengths in the deep UV region. At present, only a few kinds of glass materials are usable.

For example, as the optical glass material that can transmit, with a relatively good transmission factor, the deep UV light in the wavelength region of 230-330 nm, there are only two materials, namely silica ($SiO_2$) and calcium fluorite ($CaF_2$).

With regard to the calcium fluorite, there are problems in relation to the machining property and uniformity in quality. In consideration of this, silica will be prevailing as the optical glass material for use with the light in the deep UV region.

When a projection optical system is formed by a single glass material of silica, it is difficult to correct chromatic aberration satisfactorily. Therefore, if the light from a light source used has a substantial extension in the spectral bandwidth, the resolution cannot be improved to an extent as desired despite that the light in the deep UV region is used. In consideration of this, it will be necessary to use, in an exposure apparatu, a light source means that can provide a light having a narrow emission spectral bandwidth in the deep UV region.

As a light source that can provide a high-power light in the deep UV region and having a relatively narrow spectral bandwidth, an excimer laser is known. Usually, however, the spectral bandwidth of the laser beam from the excimer laser is on an order of 0.5 nm. If, therefore, such an excimer laser is simply used as a light source in an exposure apparatus, there will occur a problem resulting from chromatic aberration. In consideration of this, when it is desired to use an excimer laser as a light source means in the exposure apparatus, it will be necessary to incorporate in the apparatus an arrangement that can narrow the spectral bandwidth of the excimer laser beam.

SUMMARY OF THE INVENTION

The spectral bandwidth of the excimer laser beam can be narrowed by incorporating a wavelength selecting element in a laser resonator so that only a particular wavelength component within the natural spectral bandwidth of the excimer laser is forcibly oscillated. However, it has been confirmed that, where such a band-narrowed excimmer laser is used as a light source means in an exposure apparatus, mechanical vibration applied to the wavelength selecting element during the exposure operation or thermal expansion/contraction or otherwise of the wavelength selecting element itself caused in the course of the exposure operation may create a shift of the center wavelength of the excimer laser beam. If the center wavelength shifts, the focus position and the projection magnification as determined by the projection optics shift accordingly, with a disadvantageous result of deterioration in resolution. Also, errors may occur with respect to the resolvable minimum linewidth.

It is accordingly a primary object of the present invention to provide an exposure apparatus which is suitably usable with a light source means providing a light of a very narrow bandwidth, such as a band-narrowed excimer laser, and which can satisfactorily compensate for any shift of the center wavelength of the light from the light source means.

It is another object of the present invention to provide an exposure apparatus which can satisfactorily correct any error in the state of focus and/or any error in the projection magnification that may result from the shift of the center wavelength of the light used for the exposure.

It is a further object of the present invention to provide an exposure apparatus by which an image of a pattern can be projected stably with a resolution not less than a predetermined amount and substantially without error in the resolvable minimum linewidth.

Briefly, in accordance with one aspect of the present invention, to achieve at least one of the above objects, there is provided a projection exposure apparatus which comprises an illumination system for illuminating a mask pattern; a projection optical system for projecting the mask pattern being illuminated upon the surface cf a wafer so as to expose the same to the mask pattern; a wavelength detecting means effective to detect the wavelength of a light from a light source included in the illumination system; and a control means operable, in accordance with an output signal from the wavelength detecting means, to control at least one of the projection magnification of the projection optical system and the relative position of the wafer with respect to the imaging position of the mask pattern.

In one preferred form of the present invention, as will be described later, the control means operates each time an image of the mask pattern is projected or is going to be projected upon the wafer surface.

The wavelength detecting means usable in the present invention may be one that can detect the wavelength or the center wavelength of a light from a light source. Alternatively, it may be one that can detect the shift or the amount of shift of the wavelength of the light from the light source with respect to a predetermined reference wavelength. Such a reference wavelength may be one that corresponds, for example, to a design wavelength with respect to which a projection optical system of a projection exposure apparatus is designed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of a projection exposure apparatus according to one embodiment of the present invention.

DESCRIPTION OF THE PREFERRED EMBODIMENTS

Figure 2:
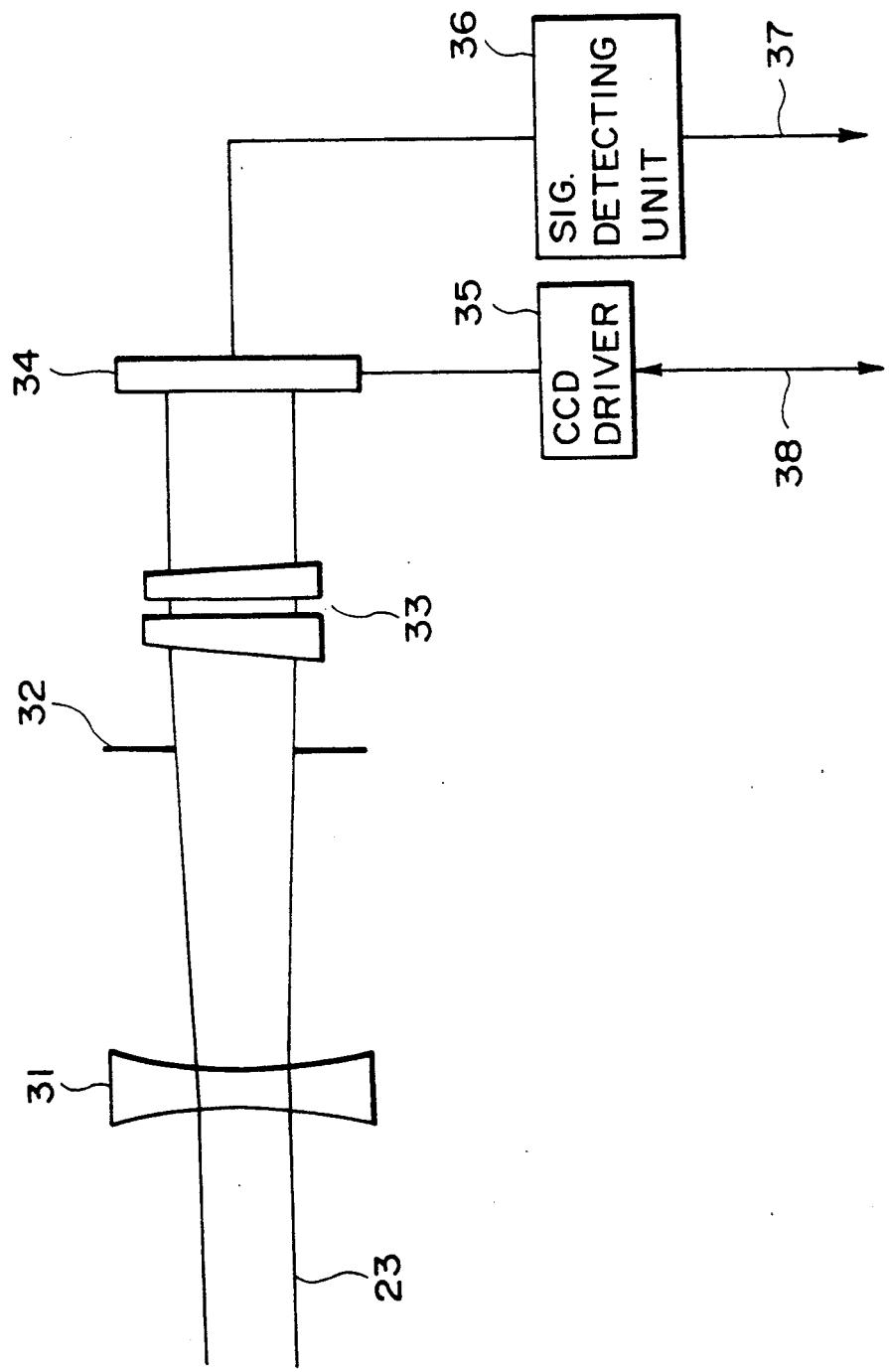
FIGS. 2 and 3 are each a schematic and diagrammatic view showing an example of wavelength detecting means usable in the exposure apparatus of the FIG. 1 embodiment.

Referring first to FIG. 1, there is shown a projection exposure apparatus according to one embodiment of the present invention. In the FIG. 1 embodiment, laser 1 which may be a band-narrowed excimer laser produces a laser beam comprising parallel light. In this embodiment, the laser 1 is a pulsed laser which emits light in the form of pulses. The laser beam from the laser 1 is divided into two by means of a half mirror 2. One of the thus split laser beams is projected upon an illumination optical system 7 by way of a deflecting mirror 4, whereas the other laser beam is incident on a wavelength detecting means 5. The laser beam incident on the illumination optical system 7 is expanded uniformly by the illumination optical system 7 so as to illuminate a reticle 15 having formed thereon a circuit pattern (hereinafter referred to as a "mask pattern"). Projection optical system 9 is effective to project the mask pattern of the reticle 15, upon the surface of a wafer 16 at a predetermined projection magnification. In this embodiment, the projection optical system 9 forms an image of the mask pattern upon the wafer 16 in a reduced scale.

The wavelength detecting means 5 is arranged to measure or detect the wavelength of the laser beam which is incident thereupon as a unit of one pulse or plural pulses. The result of detection is signaled to a control device 7.

The control device 7 is provided in order that a substantially constant projection magnification is attained on the surface of the wafer 16 and also that the wafer 16 surface is positioned constantly in the imaging plane defined by the projection optical system 9, irrespective of any shift of the wavelength of the laser beam from the laser 1. For this purpose, the control device 7 is made operable, on the basis of the result of detection by the wavelength detecting means and in accordance with a predetermined sequence, to control fine-motion driving devices 61 and 62 so as to move, along an optical axis of the projection optical system 9, movable stages (not shown) holding the reticle 15 and the wafer 16, respectively, to thereby adjust the positions of the reticle 15 and the wafer 16 in the direction of the optical axis. By this, the projection magnification is retained within a predetermined tolerance and also that the position of the wafer 16 surface is retained within the limits of tolerance for the depth of focus which tolerance is predetermined with respect to the focus position of the projection optical system 9.

Figure 3:
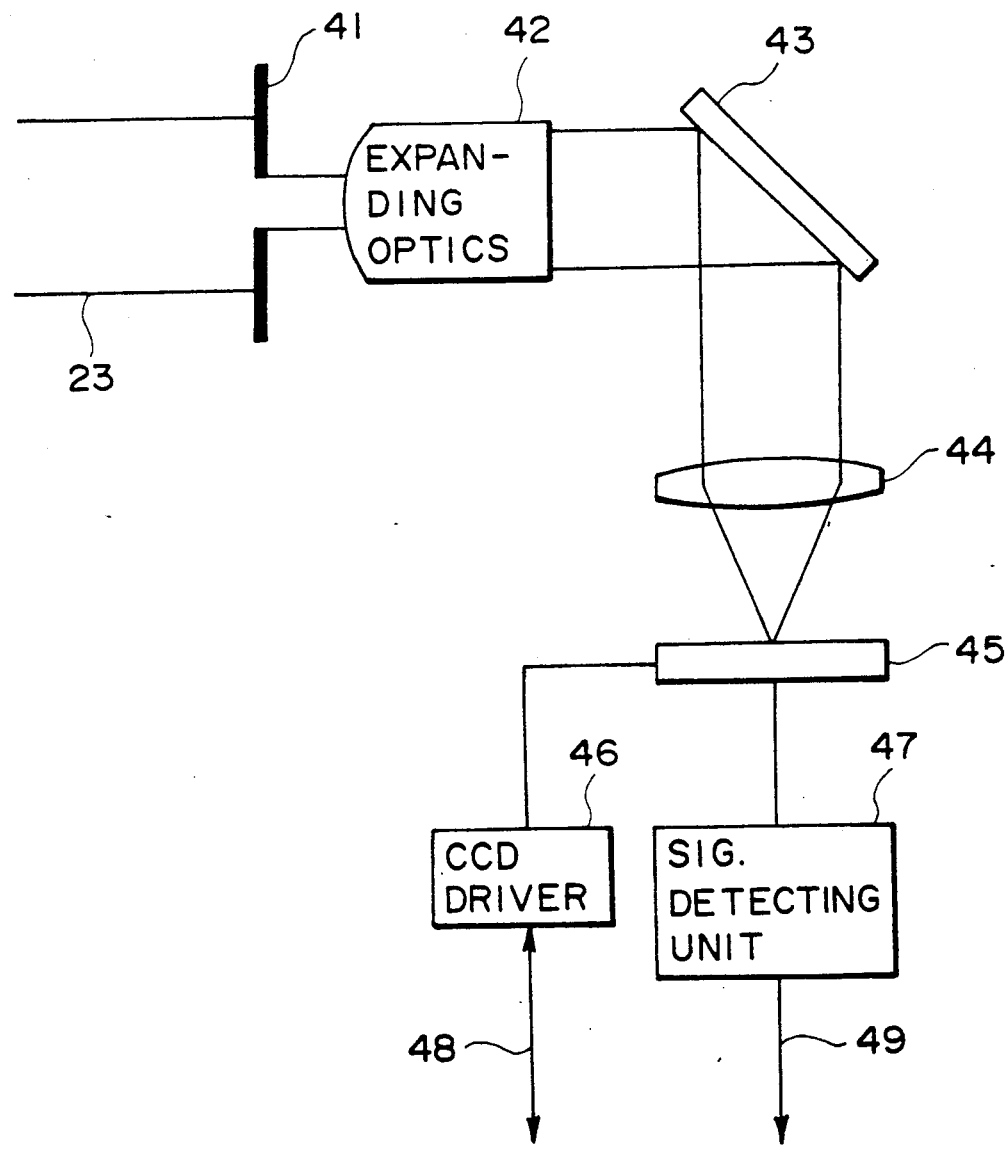

FIGS. 2 and 3 show examples which can be used as the wavelength detecting means 5 of the FIG. 1 embodiment.

In the FIG. 2 example, a concave lens 31 is effective to expand the parallel laser beam 23 from the half mirror 2 (FIG. 1). The expanded laser beam then passes through an aperture of a stop 32 and enters into an etalon 33. The laser beam emanating from the etalon 33 is incident on a CCD sensor array 34 which is driven by a driver 35. Denoted at 36 is a signal detecting unit. The driver 35 and the signal detecting unit 36 are electrically communicated by way of respective signal lines 38 and 37 with a controller (not shown) included in the wavelength detecting means.

In this example, the unshown controller is adapted to detect the amount of shift, if any, of the center wavelength of the laser beam incident on the CCD sensor array 34 with respect to a predetermined reference wavelength, on the basis of the signal from the signal detecting unit 36. The unshown controller produces a signal representing the amount of shift of the center wavelength, which signal may be applied to the control device 13 shown in FIG. 1.

More specifically, the laser beam 23 from the half mirror 2 is received by the concave lens 31 and the stop 32 and then the light passed therethrough is incident on the etalon 33, as described herein-before. The light from the etalon 33 is incident on the CCD sensor array 34. At this time, interference fringes are formed on the light-receiving surface of the sensor array by the light passed through the etalon 33. The signal detecting unit 36 is adapted to measure or detect an interval between predetermined ones of the fringes. By doing so, the amount of shift, if any, of the center wavelength from the predetermined reference wavelength can be determined.

In the FIG. 3 example, on the other hand, a stop 41 is disposed in the path of the parallel laser beam 23 divided by and reflected from the half mirror 2 (FIG. 1). The stop 41 is adapted to extract such a light flux portion which is in the neighborhood of the center of the laser beam, i.e. close to the optical axis. Expanding optical system 42 is provided to expand the parallel light flux from the stop 41 so that it emits an expanded parallel light flux. Namely, the optical system 42 is formed by an afocal optical system. Grating 43 is disposed to reflectively diffract the light from the expanding optical system 42. Convex lens 44 is effective to focus the reflectively diffracted light from the grating 43 upon a predetermined plane. CCD sensor array 45 has a light-receiving surface which is positioned in said predetermined plane. Denoted at 46 is a driver for driving the CCD sensor array 45, and denoted at 47 is a signal detecting unit. The driver 46 and the signal detecting unit 47 are electrically communicated by way of respective signal lines 48 and 49 with a controller (not shown) included in the wavelength detecting means.

In this example, the unshown controller is adapted to detect the amount of shift, if any, of the center wavelength of the laser beam incident on the CCD sensor array 45 with respect to a predetermined reference wavelength, on the basis of the signal from the signal detecting unit 47. The unshown controller produces a signal representing the amount of shift of the center wavelength, which signal may be applied to the control device 13 shown in FIG. 1.

More specifically, the laser beam passed through the stop 41 and the expanding optical system 42 is incident on the grating 43. The grating 43 provides an ordinary spectroscopic system which utilizes the phenomenon that the angle of diffraction changes with the wavelength of the light incident thereupon. Since the reflectively diffracted light from the grating 43 is focused upon the CCD sensor array 45 which functions as a detector, the wavelength of the laser beam 23 can be determined by detecting the position of the beam spot on the sensor array 45 by use of the signal detecting unit 47.

It should be noted that the wavelength detecting means used in the present invention has to be one that can show very strict precision. From this, strict holding precision is required with regard to the optical elements and the detecting elements constituting the wavelength detecting means. Thus, in the wavelength detecting means of the FIG. 2 example, the interval between two components of the etalon 33 is retained precisely. In the wavelength detecting means of the FIG. 3 example using a grating, the grating 43 is held precisely at an angle which is predetermined.

Figure 4:
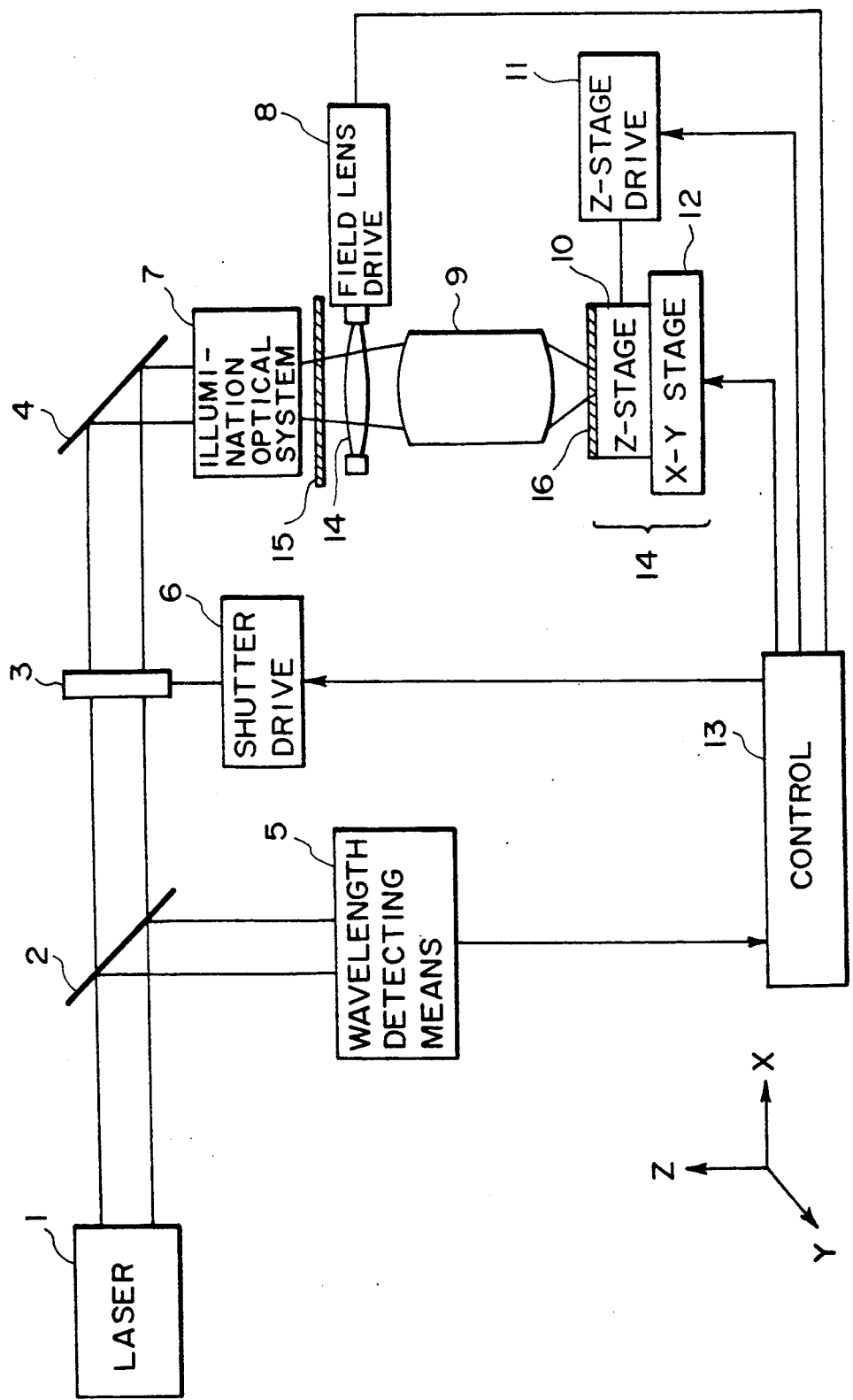
FIG. 4 is a schematic and diagrammatic view of a projection exposure apparatus according to another embodiment of the present invention.
Figure 5:
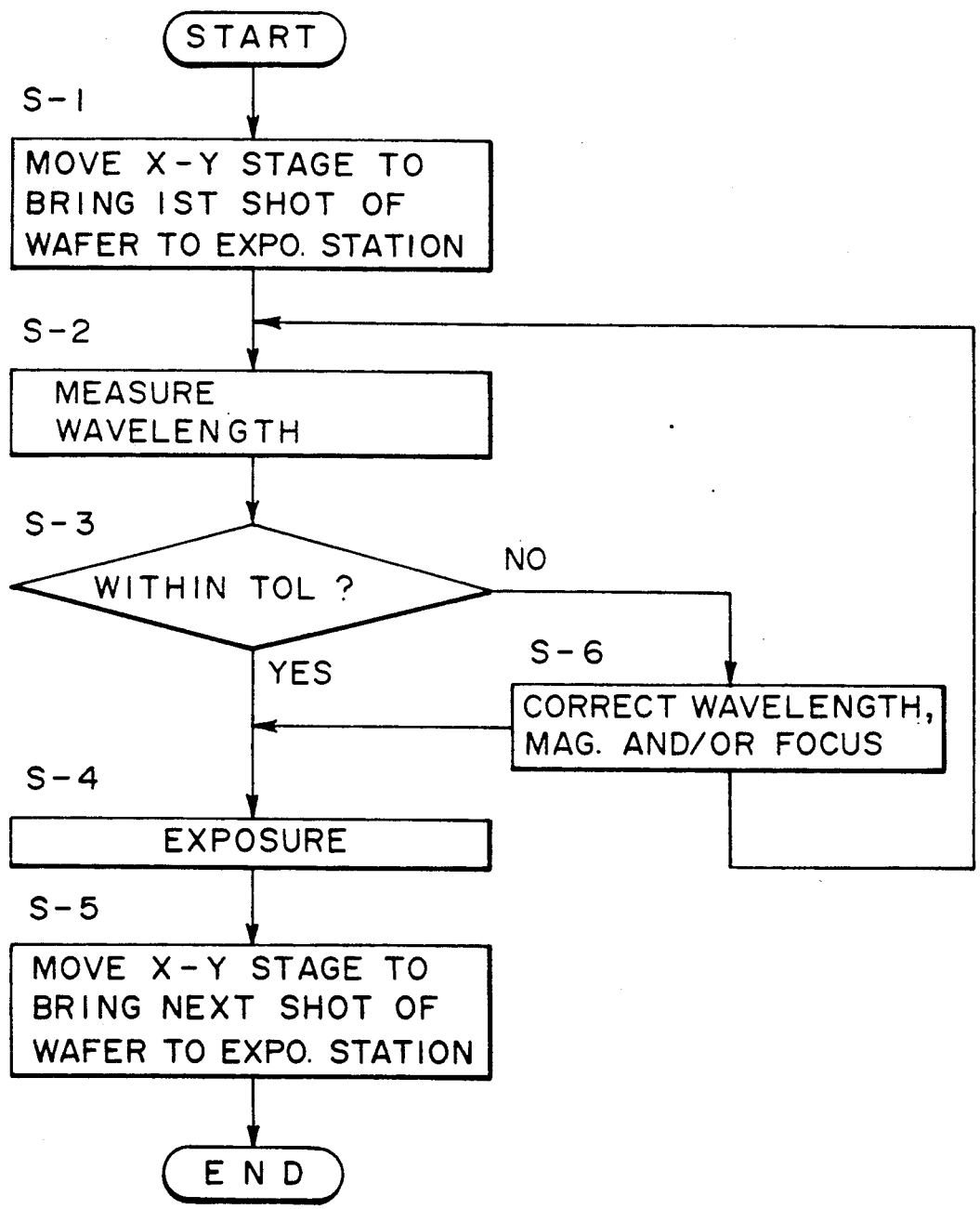
FIG. 5 is a flow chart showing the sequence of an exposure operation made in the exposure apparatus of the FIG. 4 embodiment.

FIG. 4 shows a projection exposure apparatus according to another embodiment of the present invention. Also in this embodiment, a wavelength detecting means may detect the center wavelength (or the shift thereof) of a light from a light source and, in accordance with the value of the detected wavelength (or the value corresponding to the amount of the shift of the wavelength), a control means may adjust the interval between a mask pattern and a projection optical system and the interval between the projection optical system and a wafer.

Denoted at 1 in FIG. 4 is an excimer laser adapted to supply a band-narrowed excimer laser beam which is emitted in the form of pulses. The excimer laser 1 includes a bandwidth narrowing means such as an etalon, a grating or otherwise by which the bandwidth is narrowed sufficiently. Half mirror 2 functions to divide the laser beam (which is a parallel light) from the excimer laser 1 into two, one of which is directed to a shutter 3 and the other of which is directed to a wavelength detecting means 5. The wavelength detecting means 5 may have the same structure as illustrated in FIG. 2 or 3, for example.

Total reflection mirror 4 is disposed to direct the laser beam from the shutter 3 to an illumination optical system 7. The illumination optical system 7 is arranged to expand the received light to uniformly illuminate a mask pattern of a reticle 15.

Denoted at 14 is a field lens which is arranged to be driven by a drive 8. Projection optical system 9 has an imaging magnification 1/M (M≧1) and is adapted to project the mask pattern of the reticle 15 upon the surface of a wafer 16 in a reduced scale which is predetermined. For example, M =5 or 10. The wafer 16 is placed on a movable wafer stage 14 which comprises a Z-stage 10 carrying thereon the wafer and being movable along an optical axis of the projection optical system (i.e. in the Z direction) and an X-Y stage 12 carrying thereon the Z-stage 10 and being movable in a plane (X-Y plane) orthogonal to the optical axis of the projection optical system. By controlling the movement of the wafer stage 14, the wafer 16 can be moved in any one of the X, Y and Z directions (see FIG. 4) by a desired amount. The Z-stage drive 11 is provided to drive the Z-stage 10.

In this embodiment, the shutter 3, the total reflection mirror 4 and the illumination optical system 7 form a part of an illumination system.

It should be noted that all the lens elements of the field lens 14 and the projection optical system 9 are made of silica. The field lens 14 and the projection optical system 9 are designed with respect to a particular design wavelength which is equal to the center wavelength of the laser 1 that is predetermined. Thus, both the field lens 14 and the projection optical system 9 are aberration-corrected satisfactorily with respect to the predetermined center wavelength of the laser beam from the laser 1. Therefore, when the mask pattern of the reticle 15 is irradiated with the light of the design wavelength and then is projected upon the wafer 16, the mask pattern can be transferred onto the wafer with a very good resolution.

All the lens elemerts constituting the illumination optical system 7 are made of silica, too. Namely, in the present embodiment, all of the transmission type optical components disposed in the path of the laser beam from the excimer laser 1 are made of silica. This is effective to assure efficient utilization of the laser beam and, on the other hand, to suppress the absorption of the laser beam to thereby minimize change in the optical characteristics of the optical components, such as the refractive index, for example.

On the wafer 16 surface, a plurality of shot areas are defined, although not shown in the drawing. These shot areas of the wafer 16 are aligned in sequence with respect to the mask pattern of the reticle 15 by means of an alignment system, not shown. For such alignment, any one of well-known alignment methods may be used.

When, in operation, the laser beam is supplied from the excimer laser 1 and the shutter 3 is brought into a light-blocking state for blocking the laser beam, under the influence of a shutter drive 6, the wavelength detecting means 5 measures or detects the wavelength of the pulsed laser beam reflected from the half mirror 2, per unit of one pulse or plural pulses. The result of detection is signaled to a control device 13 which comprises a central processing unit (sequence controller), a memory or otherwise. The control device 13 operates, on the basis of the detection of the wavelength and in accordance with a predetermined sequence, to supply control signals to the field lens drive 8 (with regard to the control of the projection magnification) and the Z-stage drive 11 (with regard to the control of the wafer 16 position), such that, with respect to the current wavelength just having been detected the projection magnification may be retained within a predetermined tolerance and that the wafer 16 position in the direction of the optical axis of the projection optical system may be retained in the limits of an allowable range set in relation to the depth of focus of the projection optical system. Responsive to the control signals from the control device 13, the field lens drive 8 and the Z-stage drive 11 operate to displace the field lens 14 and the Z-stage 10, respectively, to adjust the positions of the field lens 8 and the wafer 16 in the direction of the optical axis.

By doing so, in this embodiment, even if the center wavelength of the excimer laser 1 shifts, the projection magnification of the projection optical system 9 and the relative position of the wafer 16 with respect to the imaging plane of the projection optical system 9 can be retained within respective tolerances.

After completion of the above-described adjustment or correction of the projection magnification and the wafer 16 position in the direction of the optical axis, the shutter drive 6 is actuated in response to a signal from the control device 13 so as to release the interception of the laser beam. Thus, the laser beam from the excimer laser 1 can be directed to the mirror 4 so that the illumination optical system 7 can illuminate the reticle 15. By this, the mask pattern of the reticle 15 can be transferred, by projection exposure and in a reduced scale, onto the wafer by way of the projection optical system 9.

In the exposure apparatuses of the type described hereinbefore, it is known that any change in the environmental conditions such as temperature, pressure, humidity and so on, surrounding projection optics is a factor which causes the shift of the aforesaid projection magnification and/or the focus position of the projection optics. In consideration of this, one or more sensors may preferably be incorporated in the exposure apparatus to monitor at least one of these parameters simultaneously with the detection of the wavelength. Namely, the field lens drive 8 and the Z-stage drive 11 may be controlled on the basis of (i) the temperature information concerning the temperature variation in the projection optical system 9 itself and/or (ii) the ambient condition information concerning at least one of the temperature, pressure and humidity surrounding the projection optical system 9, in addition to (iii) the information concerning the shift of the wavelength.

While in the present embodiment the movable field lens 14 and the movable Z-stage 10 are used for the adjustment of the magnification and the positioning of the wafer with respect to the focus position of the projection optical system 9, the magnification correction and the focus adjustment may be made in accordance with any one of known methods such as, for example, disclosed in U.S. Pat. Nos. 4,687,322, 4,690,528 and 4,699,505. In any case using any method, the use of the output signal from the wavelength detecting means of the present invention and the correction of the magnification and the wafer position with respect to each of the shot areas on the wafer, allow accurate and correct transfer of the mask pattern onto each shot area on the wafer with a very good resolution.

In the present embodiment, the position of the wafer 16 with respect to the direction of the optical axis of the projection optical system 9 may be monitored by use of one or more air-microsensors or, alternatively, one or more optical sensors. Details of such position sensing means are described in the aforementioned U.S. patents, and are omitted here for simplification. It is to be noted however that the vertical (upward and downward) movement of the Z-stage 10, carrying thereon the wafer 16, in the direction of the optical axis of the projection optical system may be controlled by use of the wafer position signals supplied from these sensors and the output signals of the wavelength detecting means as well as the signals from various sensors monitoring the environmental conditions.

FIG. 3 is a flow chart showing the sequence of the exposure operation made in the exposure apparatus of the present embodiment.

First, at step S-1, the X-Y stage is driven to bring a first shot area of a wafer 16 to an exposure station which is underneath the projection optical system 9. Then, the first shot area of the wafer is aligned with respect to the mask pattern of the reticle. Subsequently, at step S-2, the center wavelength of the excimer laser beam just before the initiation of the "exposure" is measured. At step S-3, discrimination is made as to whether the measured wavelength is within the tolerance. If it is so, then the exposure is effected at step S-4.

If not within the tolerance, on the other hand, the control device 13 is used at step S-6 to execute the correction of the projection magnification and the focus position, as described hereinbefore, in accordance with the amount of shift of the wavelength as measured at step S-3. If desired, the operations at steps S-2 and S-3 may be repeated thereafter.

After the exposure at step S-4 is completed, the X-Y stage is moved at step S-5 so as to bring the next shot area of the wafer to the exposure station.

The above-described sequential operations are repeated. It will be understood that the adjustment of the projection magnification and the wafer position are automatically effected under the influence of the control device 13 and just before the initiation of the exposure of each shot area of the wafer.

The wavelength of a laser beam is directly affected by a medium through which the path of the laser beam is formed. If, therefore, the wavelength detecting portion is placed in an ambience in which conditions are easily variable, the change in the conditions such as temperature, pressure and so on will cause expansion/contraction of the optical elements (such as an etalon a, grating or otherwise) or detecting elements (such as CCD) or, in some cases, holding elements for holding these elements. Further, the change in the density of the medium along the optical path (i.e. the change in the refractive index of the medium) will cause an error in the measurement for the stabilization of the wavelength, which error will result in undesirable shift of the wavelength. In consideration of this, it is preferable to use the wavelength detecting means in an ambience in which conditions such as temperature, pressure, humidity and otherwise are maintained substantially constant.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a laser for supplying light;
   a stage for holding thereon an original;
   an illumination system for illuminating the original by use of the light supplied from said laser;
   detecting means for detecting any shift in the wavelength of the light from said laser;
   a projection optical system for projecting a pattern of the original upon a workpiece; and
   adjusting, responsive to detection of a shift in the wavelength of the light detected by said detecting means, for substantially correcting any error in the magnification of the patten projected by said projection optical system resulting from a shfit in wavelength, free from correcting the detected shift in the wavelength of the light from said laser.

2. An apparatus according to claim 1, wherein said adjusting means is operable to adjust an interval between the original and said projection optical system.

3. An apparatus according to claim 1, further comprising driving means effective to bring the position of the workpiece, with respect to a direction of an optical axis of said projection optical system, into coincidence with an imaging plane of said projection optical system in accordance with the detection by said detecting system.

4. An apparatus according to claim 3, wherein said driving means includes means for adjusting the position of the workpiece in the direction of the optical axis of said projection optical system.

5. An apparatus according to claim 3, wherein said laser comprises an excimer laser, wherein said apparatus further comprises means for narrowing the bandwidth of the light supplied from said excimer laser, and wherein said projection optical system is formed by lens elements made of $SiO_2$.

6. An apparatus according to claim 1, wherein said detecting means comprises a wavelength detector and a beam splitter which is disposed with inclination on a path of the light from said laser and which is operable to direct a portion of the light to said wavelength detector.

7. A method of projecting a pattern of a first object upon a second object by use of a projection optical system and a light having a wavelength, said method comprising the steps of:
detecting any shift in the wavelength of the light with which the first object is illuminated; and
executing projection of the pattern upon the second object while maintaining a substantially constant magnification, related to the projection of the pattern by use of the projection optical system, on the basis of the detected shift in the wavelength of the light free from correcting the detected shift in the wavelength of the light.

8. A projection exposure apparatus, comprising:
a light source for providing light;
a projecting device for projecting with magnification a pattern of an original upon a workpiece by use of the light from said light source, said projecting device comprising a projection optical system for forming an image of the pattern upon the workpiece and stages for holding the original and the workpiece, respectively;
an illumination optical system for directing the light from said light source toward said projecting device;
a wavelength detector for detecting any shift in the wavelength of the light; and
an adjusting device for adjusting said projecting device in response to an output of said wavelength detector, so as to substantially correct for any error in the magnification of said projecting device due to any shift in the wavelength of the light, free from correcting the shift in the wavelength of the light.

9. An apparatus according to claim 2, wherein said adjusting means comprises driving means for moving the original along an optical axis of said projection optical system to change the interval between the original and said projection optical system.

10. An apparatus according to claim 2, wherein said projection optical system comprises a plurality of lens elements, and wherein said adjusting means comprises driving means for moving a lens element of said projection optical system, which lens element is closest to the original, to change the interval between the original and said projection optical system.

11. A method of projecting a pattern of a first object to a second object by use of a projection optical system and light of a certain wavelength, at a predetermined magnification, said method comprising:
determining any shift in the wavelength of the light; and
correcting any error in the magnification caused by a shift in the wavelength free from correcting the shift in the wavelength, such that a substantially constant magnification is maintained for the projection of the pattern, both before, and after, any shift in the wavelength.

12. A projection exposure apparatus for projecting with a predetermined magnification a pattern of a first object to a second object through a projection optical system with light having a predetermined wavelength, said apparatus comprising:
supplying means for supplying the light having the predetermined wavelength;
detecting means for detecting a change in the wavelength of the light; and
correcting means, responsive to a detection of a change in wavelength of the light by said detecting means, for correcting any error in the magnification caused by the change in wavelength, free from correcting the change in the wavelength, to thereby maintain a substantially constant magnification for the projection of the pattern, both before, and after, the change in the wavelength.

13. An apparatus according to claim 12, wherein said supplying means comprises a laser for producing the light.

14. An apparatus according to claim 13, wherein said correcting means comprises means for changing an interval between the first object and the projection optical system.

15. An apparatus according to claim 13 wherein said laser comprises an excimer laser for producing a band-narrowed laser beam.

16. A method of projecting with a predetermined magnification a pattern of a first object to a second object through a projection optical system with light having a predetermined wavelength, said method comprising the steps of:
detecting a change in the wavelength of the light; and
correcting, in response to a detection of the change in the wavelength, any error in the magnification caused by the change in the wavelength, free from correcting the change in the wavelength.

17. A method according to claim 16, wherein said correcting step comprises changing an interval between the first object and the projection optical system.

18. An method according to claim 16, further comprising using a laser pulse as the light for the pattern projection.

19. A method according to claim 18, further comprising providing the laser pulse by a band-narrowed excimer laser beam.

20. A method of manufacturing semiconductor devices by projecting with a predetermined wavelength a circuit pattern of a reticle to a wafer through a projection lens system with a radiation beam having a predetermined wavelength, said method comprising the steps of:

detecting a change in the wavelength of the radiation beam; and correcting, in response to a detection of a change in the wavelength, any error in the magnification caused by the change in the wavelength, free from correcting the change in the wavelength.

21. A method according ot claim 20, wherein said correcting step comprises changing an interval between the reticle and the projection lens system.

22. A method according to claim 20, further comprising using a laser pulse as the radiation beam for the pattern projection.

23. A method according to claim 22, further comprising providing the laser pulse by a band-narrowed excimer laser beam.

24. A method according to claim 20, further comprising correcting, in response to a detection of a change in the wavelength, any deviation of a surface of the wafer from an image plane of the circuit pattern caused by the change in the wavelength.

* * * * *

UNITED STATES PATENT AND TRADEMARK OFFICE
CERTIFICATE OF CORRECTION

PATENT NO. : 5,095,190
DATED : March 10, 1992
INVENTOR(S) : Masato Aketagawa, et al.

It is certified that error appears in the above-identified patent and that said Letters Patent is hereby corrected as shown below:

COLUMN 1

Line 7, "07/538,509" should read --07/358,509--; and
Line 59, "apparatu," should read --apparatus,--.

COLUMN 4

Line 7, "focu,s" should read --focus,--.

COLUMN 8

Line 37, "as" should read --as a--; and
Line 67, "patten" should read --pattern--.

UNITED STATES PATENT AND TRADEMARK OFFICE
CERTIFICATE OF CORRECTION

PATENT NO. : 5,095,190

DATED : March 10, 1992

INVENTOR(S) : Masato Aketagawa, et al

It is certified that error appears in the above-identified patent and that said Letters Patent is hereby corrected as shown below:

COLUMN 9

Line 17, "claim 3," should read --claim 1,--.

COLUMN 10

Line 43, "claim 13" should read --claim 13,--.

Signed and Sealed this

Twenty-second Day of June, 1993

Attest:

MICHAEL K. KIRK

*Attesting Officer*   Acting Commissioner of Patents and Trademarks